United States Patent [19]

Sako et al.

[11] Patent Number: 4,819,236
[45] Date of Patent: Apr. 4, 1989

[54] DATA TRANSMISSION METHOD SUITABLE FOR A DISC

[75] Inventors: Yoichiro Sako; Shinichi Yamamura, both of Tokyo; Tamotsu Yamagami, Kanagawa, all of Japan

[73] Assignee: Sony Corporation, Tokyo, Japan

[21] Appl. No.: 5,935

[22] Filed: Jan. 22, 1987

[30] Foreign Application Priority Data

Jan. 24, 1986 [JP] Japan .................. 61-13554
Apr. 23, 1986 [JP] Japan .................. 61-93892

[51] Int. Cl.$^4$ .............................................. G06F 11/10
[52] U.S. Cl. ........................................ 371/38; 371/50
[58] Field of Search ................... 371/49, 50, 51, 37, 371/38, 39, 40

[56] References Cited

U.S. PATENT DOCUMENTS

| | | | |
|---|---|---|---|
| 4,222,072 | 9/1980 | Bailey et al. | 371/2 |
| 4,229,808 | 10/1980 | Hui | 365/234 |
| 4,306,305 | 12/1981 | Doi et al. | 371/38 |
| 4,336,612 | 6/1982 | Inoue et al. | 371/39 |
| 4,382,268 | 5/1983 | Frimet | 360/73 |
| 4,419,699 | 12/1983 | Christopher et al. | 358/340 |
| 4,532,561 | 7/1985 | Kimura et al. | 360/73 |
| 4,541,091 | 9/1985 | Nishida et al. | 371/39 |
| 4,542,424 | 9/1985 | Ishihara | 360/73 |
| 4,558,375 | 12/1985 | Sontheimer | 358/342 |
| 4,562,577 | 12/1985 | Glover et al. | 371/30 |
| 4,562,578 | 12/1985 | Odaka et al. | 371/40 |
| 4,564,945 | 1/1986 | Glover | 371/50 |
| 4,603,412 | 7/1986 | Yamazaki | 369/50 |
| 4,607,290 | 8/1986 | Murakami | 358/260 |
| 4,607,367 | 8/1986 | Ive et al. | 371/37 |
| 4,622,602 | 11/1986 | Kutaragi | 360/48 |
| 4,630,272 | 12/1986 | Fukami | 371/37 |
| 4,631,714 | 12/1986 | Kahlman et al. | 369/59 |
| 4,633,052 | 12/1986 | Doi et al. | 371/39 |
| 4,633,338 | 12/1986 | Sato | 360/59 |
| 4,641,294 | 2/1987 | Yoshimaru | 369/32 |
| 4,653,051 | 3/1987 | Sugimura et al. | 358/342 |
| 4,660,099 | 4/1987 | Sugiyama et al. | 358/342 |
| 4,660,202 | 4/1987 | Woodsum | 371/50 |
| 4,670,881 | 6/1987 | Imoto | 371/50 |
| 4,679,098 | 7/1987 | Williams et al. | 360/10.1 |
| 4,680,764 | 7/1987 | Suzuki et al. | 371/40 |
| 4,688,219 | 8/1987 | Takemae | 371/50 |
| 4,688,225 | 8/1987 | Fukami et al. | 371/37 |
| 4,688,255 | 8/1987 | Kahn | 381/16 |
| 4,696,007 | 9/1987 | Moriyama | 371/50 |
| 4,698,810 | 10/1987 | Fukuda et al. | 371/38 |
| 4,719,628 | 1/1988 | Ozaki | 371/50 |

FOREIGN PATENT DOCUMENTS

3544819A1 6/1986 Fed. Rep. of Germany .
3604374A1 8/1986 Fed. Rep. of Germany .
2168512A 12/1985 United Kingdom .
2173076A 2/1986 United Kingdom .

*Primary Examiner*—Michael R. Fleming
*Attorney, Agent, or Firm*—Philip M. Shaw, Jr.

[57] ABSTRACT

A data transmission method for data is disclosed in which a rectangular array is formed of a block of data containing n words, supplementary data necessary to transmit the n words of data and an error detecting code to detect possible errors which may occur in the block of data and the supplementary data. An error correcting code is produced for each row and column of data of the rectangular array and added thereto to thereby form a product-coded data, each data word of which is thereafter sequentially fetched and transmitted along each row of the product-coded data. When the block of data is changed from n data words to m data words, the number of data words in one direction of the rectangular array is fixed, while the number of data words in the other direction of the rectangular array is changed to m, to thereby form a new rectangular array which is also sequentially fetched and transmitted along each row of the array.

22 Claims, 5 Drawing Sheets

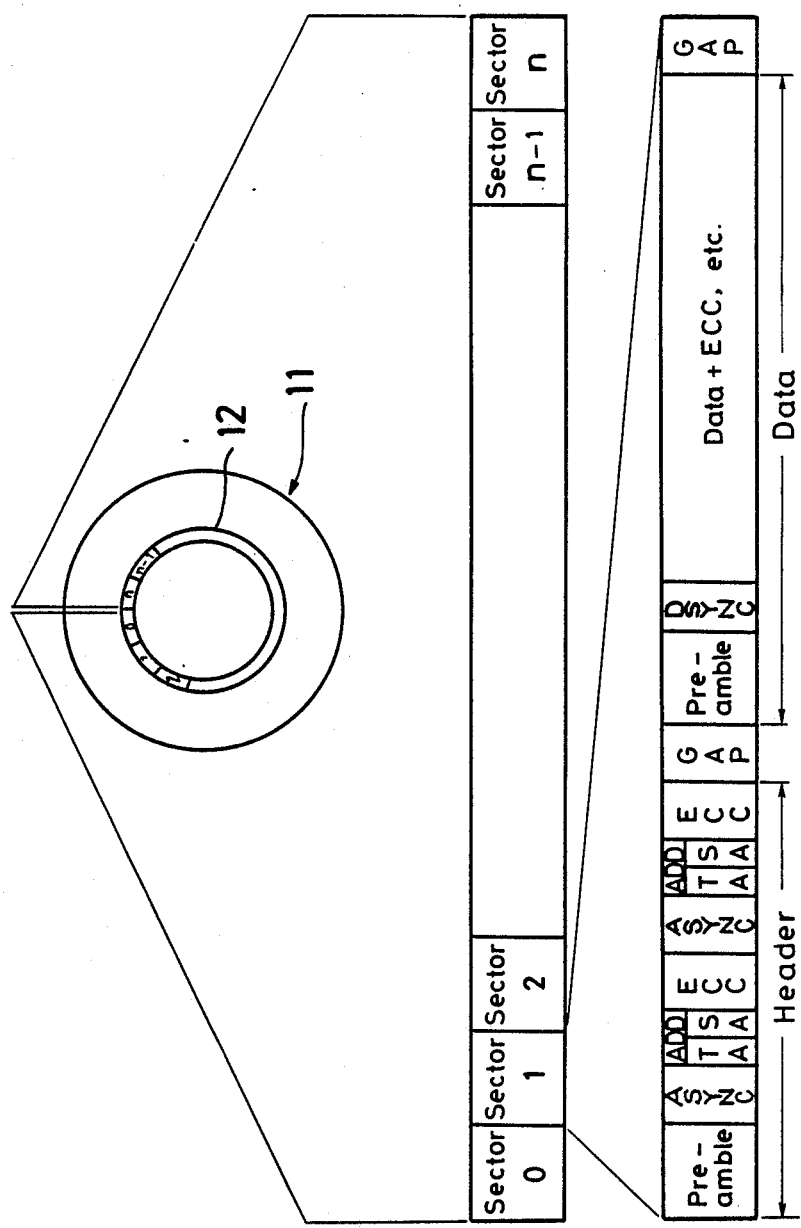

DATA TRANSMISSION METHOD SUITABLE FOR A DISC

BACKGROUND OF THE INVENTION

1. Field of the Invention

This invention relates generally to a data transmission method, and more particularly to a method of this kind which is suitable for transmitting blocks of data, each of which comprises a predetermined quantity of data, to a transmission path, for example, on a disc-shaped recording medium such as a magneto-optical disc, in the form of a track which is divided into a plurality of sectors into which the blocks of data are respectively written or recorded.

2. Description of the Prior Art

It is known to add an error correcting code and an error detecting code to data to be transmitted so as to detect and correct errors occurring in the data while the data is transmitted through a transmission path (or a recording medium). In this technique, the error correcting code (ECC), e.g., a b-adjacent code, for correcting errors occurring in a predetermined quantity of data to be transmitted is first produced and then added to the predetermined quantity of data. Next, the error detecting code (EDC) is produced on the basis of the error correcting code and the predetermined quantity of data to be transmitted. Then, the data with the error correcting code and the error detecting code is transmitted to the transmission path (or the recording medium). The data with the error correcting code and the error detecting code received through the transmission path is processed to correct a possible error thereof which may occur in the transmitted data. To be specific, by the use of the error detecting code, it is first detected whether or not a possible error exists in the received data and the error correcting code is added thereto. If it is detected that any error exists in the above data, the error in the transmitted data is corrected by the use of the error correcting code. That is, the error detecting code of the data is used to check the error before the error correcting process of the received data. Further, there is a product code which is also used to correct a possible error in data. This product code is to produce an error correcting code for each row and column of data of a rectangular array comprising a predetermined quantity of data. A known code, e.g., Reed-Solomon code, is employed as the error correcting code thus produced. These data and error correcting codes are successively transmitted in a predetermined order to the transmission path. The predetermined quanity of data with the error correcting code received through the transmission path is again arranged into a rectangular array. Then, the possible errors in the data are corrected by the use of the error correcting codes generated for each of the data in the row and column directions.

However, according to the prior art, the above-mentioned rectangular array of product code is constructed for only one kind of a recording medium. Therefore, if the data is to be recorded on a plurality of different types of recording media, each of which has a different data capacity, the data processing procedure cannot be commonly utilized for different kinds of recording media which constitutes a great inconvenience in the data processing.

OBJECTS AND SUMMARY OF THE INVENTION

Accordingly, it is the object of the present invention to provide a data transmission method which can be commonly utilized when data is recorded on a plurality of kinds of recording media.

To achieve the above object, the present invention provides a data transmission method for data formed as a rectangular array comprising a block of data formed of n words, supplementary data associated with said block of data and an error detecting code for detecting possible errors which may occur in said block of data and said supplementary data. The method comprises the steps of:

producing and adding a first error correcting code for and to each row of data of the rectangular array in which n words of data are sequentially arranged;

producing and adding a second error correcting code for and to each column of data of the rectangular array in which words of data are written to thereby form a product-coded data from the block of data, the supplementary data, the first error correcting code and the second error correcting code;

fetching and transmitting the product-coded data along the rows of the array;

when the block of data is changed in word number from the number n to a number m, varying the number of data words in the column direction of the rectangular array in response to the above change while keeping the number of data words in the row direction fixed so as to form a new rectangular array to comport with the increase in the quantity of data; and sequentially fetching and transmitting the new product-coded data forming the new rectangular array along the row direction.

The above and other objects, features and advantages of the present invention will become apparent from the following detailed description of the preferred embodiment taken in conjunction with the accompanying drawings, throughout which like reference numerals designate like elements and parts.

BRIEF DESCRIPTION OF THE DRAWINGS

FIG. 3A and 3B are a diagram showing a sector format in the case where the product coded data according to the invention is recorded in each sector of a disc-shaped recording medium.

DESCRIPTION OF THE PREFERRED EMBODIMENT

This invention provides a data transmission method in which a product code is formed for blocks of data and the product-coded data is successively transmitted via a transmission path. The method is suitable for the case where the quantity of data forming the above block of data may be varied and then transmitted.

Disc-shaped recording media are used for data storage for computers. The disc-shaped recording media can be provided with one spiral track or a plurality of cylindrical tracks, the track or tracks being divided into a plurality of sectors. Examples of this kind of recording media are floppy discs, magneto-optical discs, worm (write once read many) discs, and so on.

FIG. 3 shows an example of a sector format for a magneto-optical disc. Referring to FIG. 3, a track 12 formed on a magneto-optical disc 11 is divided into a plurality of sectors in its circumferential direction, on each of which is recorded a predetermined quantity of data with an error correcting code ECC, an error detecting code EDC and so on.

As shown in FIG. 3A, one track comprises (n+1) sectors. In this embodiment, one track is formed of 32 sectors.

A format of data to be recorded on one sector is arranged, for example, as shown in FIG. 3B. To be specific, each sector comprises a header portion, a data portion, and gap portions GAP provided behind each of the header portion and the data portion.

At the head of the header portion, preamble data are recorded and following the header portion there are twice recorded an address signal ADD, comprising track address data TA and sector address data SA, followed by an error correcting code ECC and an address synchronizing signal ASYNC.

Further, in the data portion, there are recorded at the head, preamble data and data added with an error correcting code ECC and so on to be transmitted.

In general, 512 bytes of usable data are recorded in one sector in the track formed on a floppy disc. However, other media, e.g., a magneto-optical disc, worm disc, or the like, from which data is optically reproduced, have a much larger data capacity than that of the floppy disc. For such mass data storage media, the capacity of one sector, i.e., the quantity of data which can be recorded in one sector, can be considered as set at a product value obtained by multiplying 512-bytes by a certain integer, e.g., 1024 (e.g., 512×2) bytes, in place of 512-bytes.

The present invention provides a data transmission method suitable for the case where data is transmitted to more than two different kinds of media which have different sector capacities set, respectively, at 512-bytes and a product value obtained by multiplying 512-bytes by a certain integer.

Figure 1A:
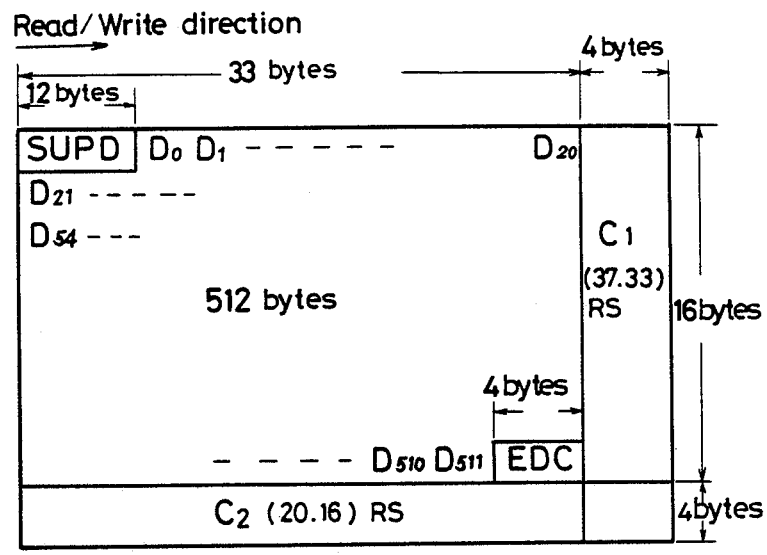
FIG. 1A is a diagram showing a first example of the construction of a product code according to the present invention.
Figure 1B:
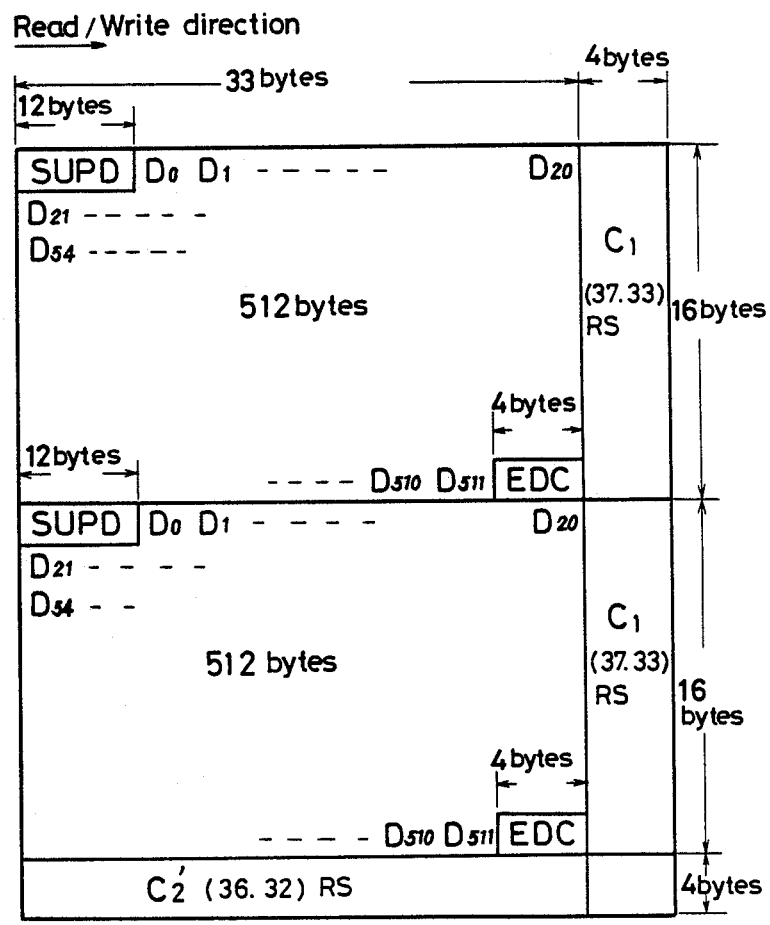
FIG. 1B is a diagram showing a modification of FIG. 1A in which the quantity of data to be transmitted is different from that shown in FIG. 1A.

FIGS. 1A and 1B are drawings showing examples of the construction of the product codes.

In FIG. 1A, 512-bytes of serial data $D_0$–$D_{511}$ form a block of data to be transmitted (or recorded). There is provided supplementary data SUPD having a length of 12-bytes which is required to transmit the 512-bytes of data. The supplementary data SUPD comprises information relative to the data to be transmitted (or recorded), e.g., information indicative of whether the data is to be processed by, for example, a computer, or is to be processed in real time such as audio signals, information indicative of a data transmission rate, information indicative of the destination of the data, information indicative of data allocation, i.e., track number, sector number, and so on, when the data is to be recorded on a disc-shaped recording medium, and information about the link between respective sectors. Further, there is provided an error detecting code EDC formed of 4-bytes, e.g. a cyclic redundancy code CRC for detecting possible errors which may occur in the block of 512-bytes of data to be transmitted and the supplementary data SUPD formed of 12-bytes. Then, the 512-bytes of data to be transmitted, the 12-bytes of supplementary data SUPD, and the 4-bytes of error detecting code are rearranged in the digital memory of the transmitting apparatus (not shown) into the form of a rectangular array which has a 33-byte length in the row direction and a 16-byte length in the column direction. A first error correcting code $C_1$, e.g., (37, 33) Reed-Solomon code is produced and added to each 33-bytes of data in the row direction. And a second error correcting code $C_2$, e.g., (20, 16) Reed Solomon code is produced and added to each 16-bytes of data in the column direction. Thus, a product code is formed. The product coded-data comprising 740 (37×20) bytes is fetched from memory and transmitted to or recorded in each sector of a disc-shaped recording medium beginning with the data located at the first column and the first row and successively along the row direction, in the form of serial data. The 740-bytes of serial data thus transmitted or recorded is again transformed into the original product code. Then, possible errors introduced into the product code during transmission are corrected in the row direction and in the column direction, respectively, by the use of a $C_1$ parity and a $C_2$ parity, that is, first and second error correcting codes $C_1$ and $C_2$. Next, the 512-bytes of data and the 12-bytes of supplementary data SUPD which are subjected to error correction by the use of the $C_1$ and the $C_2$ parities are finally checked by the use of the error detecting code EDC to determine whether or not the data contains possible errors.

FIG. 1B shows the construction of a product code when the capacity of one block of data to be transmitted is increased from 512-bytes to 1024 (512×2) bytes. It will be assumed that product-coded data having 1332 (37×36) bytes is recorded, e.g., in each sector of the track, on a disc-shaped recording medium.

The present invention deals with this increase of data contained in one block by changing the number of data words in a direction different from the sequential order in which the data is written in the rectangular array. To be specific, in FIG. 1B, the number of data in the column direction of the rectangular array is increased from 16-bytes to 32-bytes to cope with the above data increase. The product code shown in FIG. 1B is composed by stacking in memory two 528-byte rectangular arrays of FIG. 1A, each comprising 512-bytes of data, 12-bytes of supplementary data SUPD, and 4-bytes of error detecting code EDC, and the error correcting codes C1 and C2' are produced and added to each of the rows and columns of data, respectively, of the stacked rectangular array.

As shown in FIG. 1B, for the $C_1$ parity, the same (37, 33) Reed-Solomon code is used which was used for the array of FIG. 1A, and for the $C_2'$ parity, a (36, 32) Reed Solomon code is used. Each of 12-bytes of supplementary data SUPD contains information indicative of the quantity of data contained in one block to be transmitted (1024-bytes), information indicative of which of the two blocks each of the 512-bytes of data is located in, information indicative of the transmission rate of the data, and so on.

Figure 2A:
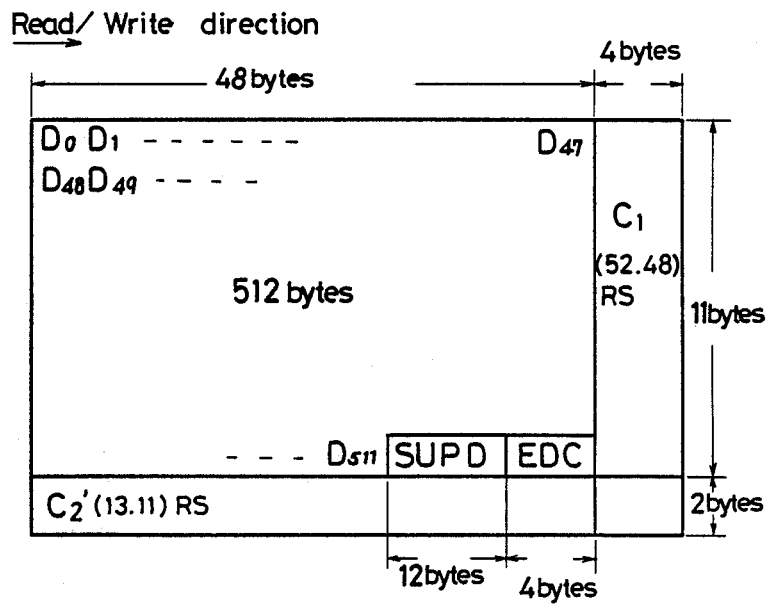
FIG. 2A is a diagram showing a second example of the construction of a product code according to the present invention.
Figure 2B:
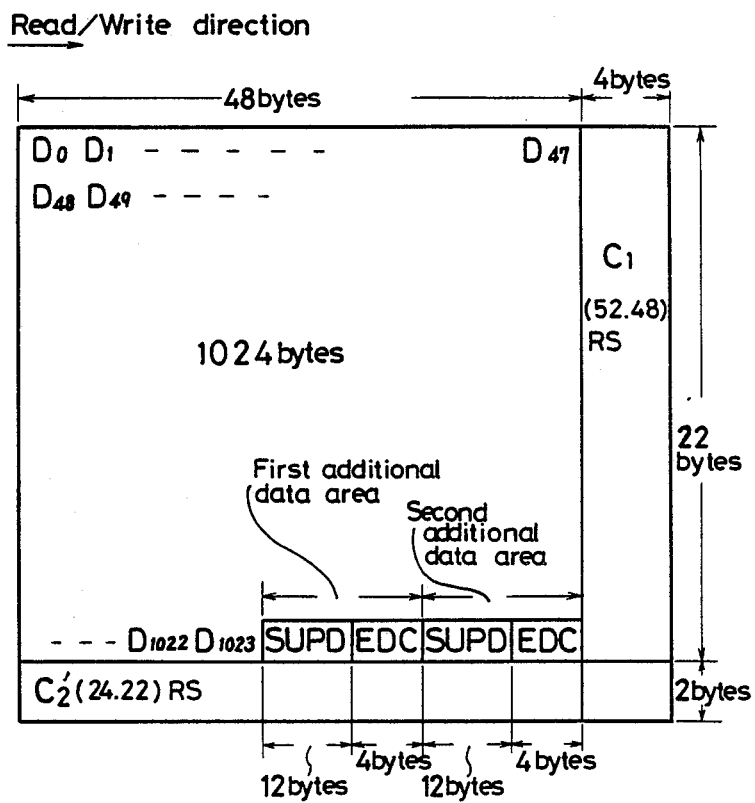
FIG. 2B is a diagram showing a modification of FIG. 2A in which the quantity of data to be transmitted is different from that shown in FIG. 2A.
Figure 2C:
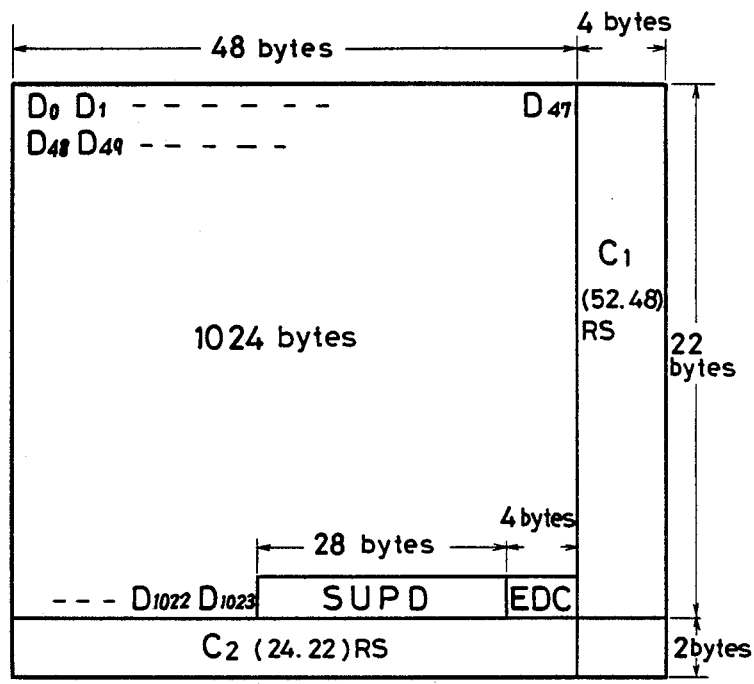
FIG. 2C is a diagram showing a modification of FIG. 2B.

FIGS. 2A to 2C show the construction of product codes in which the supplementary data SUPD in the examples of FIGS. 1A and 1B is placed after the data to be transmitted, that is, in front of the error detecting code EDC.

Referring to FIG. 2A, added after the 512-bytes of data to be transmitted is the supplementary data SUPD having 12-bytes which is required to transmit the 512-bytes of data. Further, the 4-bytes of error detecting code EDC, such as cyclic redundancy code CRC, for detecting possible errors in the 512-bytes of data and the supplementary data SUPD of 12-bytes is produced and added to the above-mentioned data. The 528-bytes of data is formed into a rectangular array which has a 48-byte length in the row direction and an 11-byte length in the column direction. Then, a $C_1$ parity having 4-bytes, e.g., a (52, 48) Reed-Solomon code, is produced and added to each row of 48-bytes of data of the rectangular array. Also, a $C_2$ parity having 2-bytes, e.g., a (13, 11) Reed-Solomon code, is produced and added to each 11-bytes of data arranged in the column direction of the rectangular array. Data in the product code thus constructed is successively fetched and transmitted from the first column, first row along the row direction.

FIG. 2B shows the construction of a product code in which one block of data to be transmitted in FIG. 2A is increased from 512-bytes to 1024 (512×2) bytes. As is clear from FIG. 2B, a second block of 512-bytes of data is placed after a first block of 512-bytes of data. Placed after the second block of 512-bytes of data are the 12-bytes of supplementary data SUPD and the error detecting code EDC for the first block of data followed by the SUPD and EDC for the second block of data, to thereby form a rectangular array having 1056 (48×22) bytes of data. Next, in the same manner as shown in FIG. 1A, a $C_1$ parity, e.g., a (52, 48) Reed-Solomon code, is produced and added to each row of the rectangular array of the 48-bytes in the row direction. Then, a $C_2$ parity, e.g., a (24, 22) Reed-Solomon code, is produced and added to each column of 22 data bytes of the rectangular array. Finally, a product code having 1248 (52×24) bytes is thus produced. The data in the product code is successively fetched and transmitted beginning with the first column, first row and then along the row direction.

Incidentally, in FIG. 2B, the 512-bytes of data is taken as a fundamental unit and the 12-bytes of supplementary data SUPD and the 4-bytes of error detecting code EDC to be added to each block of the 512-bytes of data are located close to each other after the 1024-bytes of data. However, in FIG. 2C, 1024-bytes of data is specified as a fundamental unit and, for example, 28-bytes of supplementary data SUPD and 4-bytes of error detecting code EDC are produced to detect the possible errors of the former. In this case, a rectangular array having a 48-byte row length and a 22-byte column length is produced. Therefore, in FIG. 2C the number of data words in the row direction is the same as that of the rectangular array shown in FIG. 2A, while the number of data words in the column direction is increased. Note that the same $C_1$ parity can be used for each array.

Figure 4:
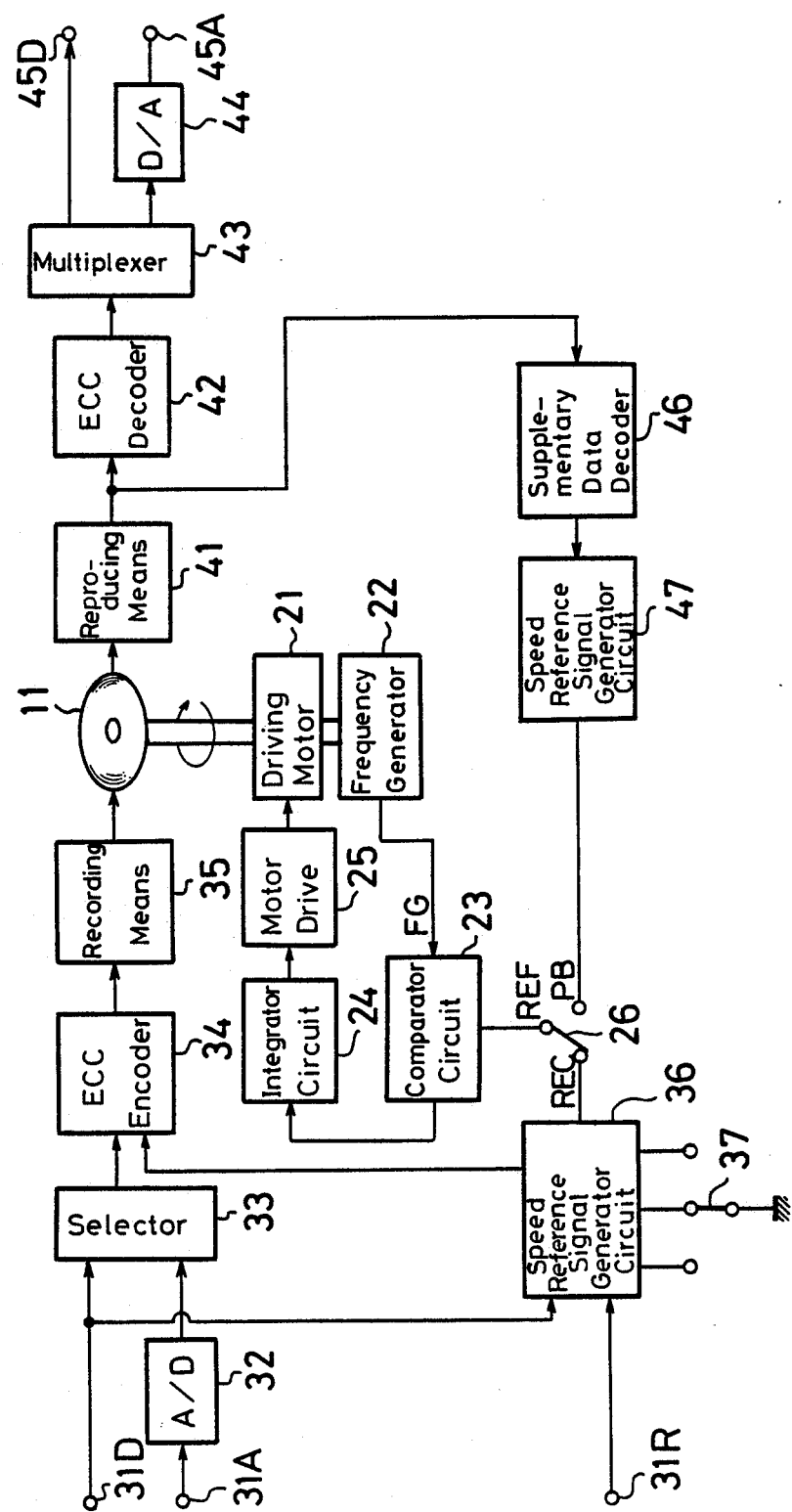
FIG. 4 is a block diagram showing the construction of an apparatus for recording and reproducing the product-coded data on a disc-shaped recording medium, according to the invention.

FIG. 4 is a block diagram showing the construction of a recording and reproducing apparatus for recording the above described product-coded data on and reproducing the same from a disc-shaped recording medium.

Reference numeral 11 designates a magneto-optical recording disc including, e.g., a spiral-shaped track on which the above data is recorded. A recording and reproducing head (not shown) in the apparatus is controlled such that the head correctly scans the previously formed track.

Reference numeral 21 designates a disc driving motor and the disc 11 is controlled by the driving motor 21 such that the disc 11 is rotated at a predetermined speed, i.e., at a constant angular velocity. The driving motor 21 is provided with a frequency generator 22 which generates a frequency signal FG proportional to the rotational speed of the driving motor 21. The frequency signal FG is supplied to a phase comparator circuit 23. The phase comparator circuit 23 is also supplied with ine of two speed reference signals REF selected by a switch 26. Although this speed reference signal REF can be varied according to the transmission rate of data to be recorded or reproduced, as will later be described in detail, on playback (PB) it has a frequency equal to that of the output signal FG from the frequency generator 22 when the disc 11 is rotated at a desired rotational speed. The speed reference signal REF can be substituted by a frequency signal which can be obtained by dividing the frequency of the signal FG. In this case the output signal FG should also be divided by the same dividing ratio before being supplied to the comparator circuit 23.

An output signal from the phase comparator circuit 23, i.e., the comparison result, is integrated by an integrator circuit 24 to be a speed error signal indicative of the difference between the speed reference signal and the actual rotational speed of the motor 21. The signal is fed back to the motor 21 through a motor drive 25 so that the motor 21 rotates at an angular velocity corresponding to the speed reference signal REF.

Reference is now made to a recording system arranged in the apparatus according to the invention. Reference numeral 31D designates an input terminal to which are inputted digital signals such as data from a computer, time sampled analog data, for example, analog audio data sampled at various predetermined sampling frequencies with each value being sampled as one word made of a predetermined number of bits, digital data at various transmission rates of data, and so on. Reference numeral 31A designates an input terminal to which are supplied analog signals, e.g., audio signals.

Digital data inputted to the terminal 31D are supplied to a selector 33 while analog signals inputted to the terminal 31A are first supplied to an A/D converter 32 to be converted into corresponding digital signals. The sampling frequency of the A/D converter 32 can be changed to various values, e.g., 32 kHz, 44.1 kHz, 48 kHz, and so on. Further, it is possible that the sample can be selected from various numbers of bits, e.g., 8-bits, 12-bits, 16-bits and so on. In the case of such digitally converted analog signals, particularly in the case of digitally converted audio signals, the resulting signal has a correlation among data words so that an erroneous word can be interpolated by words located at the vicinity of said erroneous word. This is because changes in amplitude of an analog signal are not as likely to be abrupt as in the case of a digitally generated signal. The digital signal from the A/D converter 32 is supplied to the selector 33.

The selector 33 selects, by manual operation or a control signal supplied thereto from an external circuit (not shown), either the digital signals from the input terminal 31D or the A/D converter 32. The digital signal selected by the selector 33 is then supplied to an ECC encoder 34, wherein the data are transformed into a product-coded block of data (e.g., 512-bytes) to be recorded in one sector on the track of the disc-shaped recording medium 11 according to the method heretofore described. The data processed by the ECC encoder 34 is supplied to recording means 35 to be adequately modulated. The output of the recording means is supplied to the head as serial data and is then recorded on the magneto-optical disc 11.

At that time, the rotational speed of the disc 11 is controlled so as to be synchronized with the transmission rate of the digital data to be recorded. The switch 26 is changed over to a REC terminal side so that the speed reference signal generated from a speed reference signal generator circuit 36 is supplied to the phase comparator circuit 23 as the speed reference signal REF.

If data to be recorded is the digital signal from the input terminal 31D and if the data is self-clocking data, the data from the input terminal 31D is supplied to the speed reference signal generator circuit 36, wherein a clock signal is extracted from the data, the transmission rate is calculated on the basis of the clock signal, and a speed reference signal corresponding to the transmission rate calculated is generated by the circuit 36.

On the other hand, if data from the input terminal 31D is not self-clocking data, that is, if a signal indicative of the transmission rate of the data, e.g., a clock signal is separately sent from the data, the signal indicative of the transmission rate is supplied through an input terminal 31R to the speed reference signal generator circuit 36 which generates a speed reference signal corresponding to the transmission rate obtained from the signal indicative of the transmission rate.

If the data to be recorded is an analog signal inputted from the input terminal 31A and converted into digital data by the A/D converter 32, a switch 37 is changed over according to the aforementioned sampling frequency and the bit number of one word length is selected, so that a speed reference signal corresponding to the transmission rate is generated by the speed reference signal generator circuit 36.

Assume, for example, that non-self-clocking, digital signal having a known transmission rate is inputted to the terminal 31D but the signal indicative of the transmission rate is not transmitted. In this case a speed reference signal corresponding to the known transmission rate can be selected by the switch 37.

The motor 21 is driven in a manner such that the phase (frequency) of the speed reference signal corresponding to the transmission rate of the inputted data and that of the frequency signal generated by the frequency generator 22 coincide with each other, and thereby the disc 11 is rotated at a rotational speed in synchronism with the transmission rate of the inputted data.

The signal indicative of the transmission rate of the data from the signal generator circuit 36 is supplied to the ECC encoder 34 and then recorded on the disc 11 as a portion of the supplementary data SUPD. Also recorded as a portion of the supplementary data SUPD are the sampling frequency and the bit number forming one word length of the data.

If an ECC-encoded digital signal with parity and other redundancy bits is inputted to the terminal 31D, it is necessary to decode the signal to make it only inherent digital data.

The data indicative of the transmission rate of the recorded data may be recorded in a directory area which is allocated in the most inner track or the most outer track of the disc.

Next, a reproducing system of the apparatus according to the invention will be hereinafter described with reference to FIG. 4.

The digital signal reproduced from the disc 11 by an optical reproducing head (not shown) is supplied to a reproducing means 41 to be demodulated. The digital signal from the reproducing means 41 is then supplied to a supplementary data decoder 46 wherein the signal indicative of the transmission rate, recorded in the supplementary data area of each sector, is decoded. A speed reference signal generator circuit 47 is now supplied with the decoded signal indicative of the transmission rate, allowing a corresponding speed reference signal to be generated. The speed reference signal in turn is supplied to the phase comparator circuit 23 through a playback terminal side PB of the switch 26. Thus, the disc 11 is rotated at a rotational speed in synchronism with the transmission rate of the recorded data.

The speed reference signal for controlling the rotation of the disc upon playback or reproduction can be generated by previously reading, prior to the data reproduction, the data indicative of the transmission rate which is recorded in the directory area of the disc. Moreover, if the transmission rate recorded on the disc is known by a memory or the like, it is of course possible to manually change the speed reference signal.

The data thus reproduced from the disc rotating at a rotational speed in synchronism with the data transmission rate is supplied to an ECC decoder 42 through the reproducing means 41. The ECC decoder carries out error correction and so on for each sector and then makes the data only inherent data, i.e., with redundancy data removed. If the reproduced data thus processed is digital data, the data is delivered to an output terminal 45D by a multiplexer 43. On the other hand, if the reproduced data is digital data converted from an analog signal, the data is supplied to a D/A converter 44 to be reconverted into an analog signal before being delivered to an output terminal 45A.

The data required to effect D/A conversion, e.g., the sampling frequency and the bit number of one word of data in the D/A converter 44, can be previously known by decoding the supplementary data or reading the data recorded in the directory area. The D/A conversion in response to this known data can then be effected.

In this embodiment, the driving motor 21, i.e., the rotation of the disc 11, is controlled to rotate at a constant angular velocity. However, the above described technique can be applied to the case where the driving motor 21 is controlled to rotate the disc 11 at a constant linear velocity.

As described above, when the size of a block containing data to be transmitted is varied, the present invention adjusts to this variation in the block size by altering the number of data words in one direction (in the column direction) of the rectangular array while keeping the number of data words in the other direction (in the row direction) the same. According to this method, although different sizes of blocks are to be transmitted, these blocks are reformed into blocks containing the same quantity of data and some of the same error correcting codes ($C_1$ parity) are generated for each reformed block. It is therefore possible to utilize in common the same hardware, such as the $C_1$ error code generator, when different sized blocks of data are to be transmitted. Also, when the transmitted data are decoded, it is possible to commonly utilize an error correcting process in which possible errors occurring in the transmitted data are corrected by the use of the same error correcting codes ($C_1$ parity).

Further, while in all of the above examples the number of data words has been increased, it should be apparent that the reverse process is also possible utilizing the teachings of the invention. Thus, an array of 1056-bytes of data (FIG. 1B) can be reformed as two 740-byte arrays (FIG. 1A).

The above description is given on a single preferred embodiment of the invention, but it will be apparent that many modifications and variations could be effected by one skilled in the art without departing from the spirit or scope of the novel concepts of the invention so that the scope of the invention should be determined by the apped claims only.

We claim as our invention:

1. A data transmission method for data formed as a rectangular array of rows and columns comprising a block of data formed of a predetermined number (n) of words, where n is a real integer, supplementary data associated with said block of data and an error detecting code to detect possible errors which may occur in said block of data and said supplementary data, said method comprising the steps of:
    producing and adding a first error correcting code for and to each row of data of said rectangular array along which said data of n words are sequentially arranged;
    producing and adding a second error correcting code for and to each of column of data of said rectangular array to thereby form a product-coded data from said block of data, said supplementary data, said first error correcting code and said second error correcting code;
    fetching and transmitting said product-coded data along said row;
    changing said block of data in word number from the number n to a number m, where m is a selected real integer, by varying the number of data in said column of said rectangular array in response to the above change while the number of data in said row is fixed so as to form a new rectangular array to adjust for the variation in the quantity of data; and
    sequentially fetching and transmitting said new product-coded data formed of said new rectangular array along said row.

2. The method according to claim 1, in which said block of data is formed of a digitally converted audio signal which has a correlation among data words and in which an erroneous word can be interpolated by words located at the vicinity of said erroneous word.

3. The method according to claim 1, in which said block of data does not have any correlation among data words so that an erroneous word cannot be interpolated by words located at the vicinity of said erroneous word.

4. The method according to claim 1, in which said number n is 512 and said number m is 1024 ($512 \times 2$).

5. The method according to claim 1, in which said rectangular array is formed such that after said supplementary data there is placed a block of data formed of a predetermined number of words and after said block of data there is located said error detecting code.

6. The method according to claim 1, in which said rectangular array is formed with said supplementary data and said error detecting code placed after a block of data formed of a predetermined number of words.

7. The method according to claim 6, in which said supplementary data is placed after said block of data and said error detecting code is placed after said supplementary data.

8. The method according to claims 1 or 6, in which said supplementary data includes information indicative of the transmission rate of said block of data.

9. The method according to claims 1 or 6, in which said supplementary data includes information indicative of the sampling frequency of said block of data.

10. The method according to claims 1 or 6, in which said supplementary data includes information indicative of whether or not an erroneous word in said block of data can be interpolated.

11. A method for sequentially recording on a multi-sectored disc-shaped recording medium, data received as a block formed of a predetermined number (n) of words, where n is a real integer, supplementary data associated with said block of data and an error detecting code to detect possible errors which may occur in said block of data and said supplementary data, said data forming a rectangular array of rows and columns, said method comprising the steps of:
    producing and adding a first error correcting code for and to each row of data of said rectangular array in which said data of n words are sequentially arranged;
    producing and adding a second error correcting code for and to each column of data of said array to thereby form a product-coded data from said block of data, said supplementary data, said first error correcting code and said second error correcting code;
    sequentially fetching said product-coded data along said row of the array;
    recording said fetched product-coded data in each sector formed on a disc-shaped recording medium, each of said sectors having a capacity for recording product-coded data formed of D words;
    recording a product-coded data block formed of m words, where m is a real integer, in each said sector in place of said product-coded data block formed of n words by varying the number of data words arranged in said column of said rectangular array in response to the change of data word number while the number of data words arranged in said rows is fixed, so as to form a new rectangular array; and
    sequentially fetching said new product-coded data forming said new rectangular array along each row and recording the data in each sector of said recording medium.

12. The method according to claim 11, wherein said received block of data is formed of a digitized audio signal which has a correlation among data words and in which an erroneous word can be interpolated by words located in the vicinity of said erroneous word.

13. The method according to claim 11, wherein said received block of data is comprised of data which has no correlation among data words so that an erroneous word cannot be interpolated by words located in the vicinity of said erroneous word.

14. The method according to claim 11, wherein said number n is 512 and said number m is 1024 (512×2).

15. The method according to claim 11, wherein said received rectangular array is formed such that the supplementary data is followed by a block of data formed of a predetermined number of data words which, in turn, is followed by said error detecting code.

16. The method according to claim 11, wherein said received rectangular array is formed such that said block of data formed of a predetermined number of words is followed by said supplementary data and said error correcting code.

17. The method according to claim 16, wherein said received supplementary data is placed after said block of data and said error detecting code is placed after said supplementary data.

18. The method according to claim 11, wherein said received supplementary data includes information indicative of a transmission rate of said block of data.

19. The method according to claim 11, wherein said received supplementary data includes information indicative of a sampling frequency of said block of data.

20. A method for sequentially recording on a plurality of different types of multi-sectored disc-shaped recording media, data received in blocks formed of a predetermined number (n) of words, where n is a real integer, supplementary data associated with each said block of data and an error detecting code to detect possible errors which may occur in each said block of data and said supplementary data, said data forming a first rectangular array of rows and columns, said method comprising the steps of:

producing and adding a first error correcting code for and to each row of data of said first rectangular array in which said data of D words are sequentially arranged;

producing and adding a second error correcting code for and to each column of data of said first array to thereby form a product-coded data from said block of data, said supplementary data, said first error correcting code and said second error correcting code;

sequentially fetching said product-coded data along each row of said first array;

recording said fetched product-coded data in each sector formed on a first disc-shaped recording medium, said sector having a capacity for recording product-coded data formed of n words;

recording a product-coded data block formed of m words, where m is a real integer, in each sector formed on a second disc-shaped recording medium, said sector of said second recording medium having a capacity for recording product-coded data formed of m words, by varying the number of data words arranged in said column in response to the change of data word number while the number of data words arranged in said rows is fixed, so as to form a second rectangular array; and sequentially fetching said second product-coded data forming said second rectangular array along each row thereof and recording the data in each sector of said second recording medium.

21. The method according to claims 11 or 20 wherein the predetermined number m is an integer multiple of n.

22. The method according to claims 11 or 20 wherein the corresponding the rows of all arrays of product-coded data have the same error correcting codes.

* * * * *